(12) United States Patent
Robinson et al.

(10) Patent No.: US 9,030,263 B2
(45) Date of Patent: May 12, 2015

(54) TRANSIMPEDANCE AMPLIFIER (TIA) CIRCUIT AND METHOD

(71) Applicant: Avago Technologies General IP (Singapore) Pte. Ltd., Singapore (SG)

(72) Inventors: Michael Robinson, Freemont, CA (US); Vishant Tyagi, Santa Clara, CA (US); Peter Ho, Union City, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 91 days.

(21) Appl. No.: 13/838,039

(22) Filed: Mar. 15, 2013

(65) Prior Publication Data

US 2014/0266453 A1    Sep. 18, 2014

(51) Int. Cl.
H03F 3/08        (2006.01)
H03G 3/30        (2006.01)

(52) U.S. Cl.
CPC .................................. *H03G 3/3063* (2013.01)

(58) Field of Classification Search
CPC . H03G 1/0047; H03G 3/3084; H03G 1/0023; H03G 1/008; H03F 3/087; H03F 3/082; H03F 3/085; H03F 3/08; H03F 3/45475; G01J 1/44; H04B 10/6931; H04B 10/6911; G01N 21/5907
USPC .................. 330/59, 308; 250/214 A, 214 AG
See application file for complete search history.

(56) References Cited

U.S. PATENT DOCUMENTS

| | | | |
|---|---|---|---|
| 5,483,200 A * | 1/1996 | Okabayashi et al. | 330/308 |
| 6,342,694 B1 * | 1/2002 | Satoh | 330/308 |
| 6,583,671 B2 | 6/2003 | Chatwin | |
| 6,879,216 B2 * | 4/2005 | Chen et al. | 330/308 |
| 7,030,702 B2 | 4/2006 | Denoyer et al. | |
| 8,766,728 B2 * | 7/2014 | Ito et al. | 330/308 |
| 2009/0051442 A1 * | 2/2009 | Seo et al. | 330/308 |
| 2012/0218036 A1 | 8/2012 | Norman | |

OTHER PUBLICATIONS

Keiji Tanaka, Morihiro Seki, Seigo Furudate, Akihiro Moto, Toshio Takagi, Satoshi Yoshikawa, Tomoya Saeki, Katsumi Uesaka, SDH/Sonet Multi-rate SFP Module with Gain Selectable Transimpedance Amplifier and Extinction Ratio Control Unit, Journal, 2007, pp. 1294-1299, Electronic Components and Technology Conference, Reno, Nevada, United States.

* cited by examiner

*Primary Examiner* — Khanh V Nguyen

(57) ABSTRACT

A TIA circuit and method are provided that merge the automatic gain control function with the bandwidth adjustment function to allow the TIA circuit to operate over a wide dynamic range at multiple data rates. The TIA circuit has an effective resistance that is adjustable for adjusting the gain and the bandwidth of the TIA circuit. The mechanism of the TIA circuit that is used to adjust the effective resistance, and hence the gain and bandwidth of the TIA circuit, is temperature independent, and as such, the performance of the TIA circuit is not affected by temperature variations.

24 Claims, 6 Drawing Sheets

TRANSIMPEDANCE AMPLIFIER (TIA) CIRCUIT AND METHOD

TECHNICAL FIELD OF THE INVENTION

The invention relates to optical communications systems and networks. More particularly, the invention relates to a transimpedance amplifier (TIA) circuit for use in an optical receiver of an optical communications network.

BACKGROUND OF THE INVENTION

A typical optical transceiver module currently used in optical communications includes a transmitter portion and a receiver portion. The transmitter (TX) portion includes a laser driver, which is typically an integrated circuit (IC), one or more laser diodes, and an optics system. The laser driver outputs electrical signals to the laser diodes to modulate them. When the laser diodes are modulated, they output optical signals, which are then directed by the optics system of the TX portion onto the ends of respective transmit optical fibers or waveguides held within a connector that mates with the transceiver module. The TX portion typically also includes an open loop or closed loop optical output power control system for maintaining the average optical output power levels of the lasers at substantially constant levels.

The receiver (RX) portion of the optical transceiver module typically includes at least one photodiode, at least one TIA, and at least one limiting amplifier (LA). The photodetector, which is typically a P-intrinsic-N (PIN) photodiode, produces an electrical current signal in response to light detected by the photodetector. The TIA forms the front-end of the RX portion. The photodiode converts the input light into an electrical current signal and presents it at the input of the TIA. The TIA converts this electrical current signal into an output voltage having some gain, commonly referred to as transimpedance gain, and this signal is further processed by other stages (i.e., the LA, output driver, etc.) in the RX portion.

The TIA handles input signals (the photodiode output) of varying optical modulation amplitude (OMA) and average power ($P_{avg}$), and therefore needs to have a wide input dynamic range. OMA is expressed as OMA=P1−P0, where P1 is the optical power generated by the laser diode when it is in the logic 1 state and P0 is the optical power generated by the laser diode when it is in the logic 0 state. The average optical power is expressed as $P_{avg}$=(P1+P0)/2. Another important term is extinction ratio (ER), which is defined as the ratio between the two optical power levels, ER=P1/P0. OMA is related to $P_{avg}$ and ER as: OMA=2*$P_{avg}$*(ER−1)/(ER+1). The photodector creates an average current, $I_{AVG}$, corresponding to $P_{AVG}$ and has a current amplitude, CA, corresponding to OMA. The TIA amplifies the current to create a modulated signal with a Voltage Modulation Amplitude, VMA, which is used in some cases to control the automatic gain control function.

Wide input dynamic range calls for the use of an automatic gain control (AGC) circuit in the RX portion for automatically adjusting the gain of the TIA based on the amplitude of the input signal. Without an AGC circuit, the TIA tries to convert the current into a corresponding output voltage with its transimpedance gain as the amplitude of input signal current increases. When this happens, however, the transimpedance gain is limited by the voltage headroom (the maximum high and low output voltage for linear operation of the TIA) as the output voltage swing increases, which results in the output signal becoming distorted. Hence, an AGC circuit is needed in order to lower the gain of the TIA as the amplitude of the input signal grows so as to prevent the TIA from saturating and producing distortion at its output. In addition, the TIA also needs to operate at multiple data-rates, which requires adjustment of the bandwidth of the TIA.

FIG. 1 is a block diagram of a typical TIA circuit 2 that has resistive feedback architecture. The TIA circuit 2 comprises a feedback resistor $R_F$ 3, a first metal oxide semiconductor field effect transistor (MOSFET) $M_{BW}$ 4, a second MOSFET $M_{DC}$ 5, a resistor 6, a third MOSFET $M_{AGC}$ 7, a photodiode 8, first and second bipolar junction transistors (BJTs) 9 and 11, a current source 12, and a dummy side 13. The dummy side 13 comprises resistors 14 and 15, BJTs 16 and 17, and current source 18 that mirror resistors 3 and 6, BJTs 9 and 11, and current source 12, respectively. The value of the feedback resistor, $R_F$, 3 is either fixed or minimally adjustable and serves to set the gain and bandwidth ranges of the TIA circuit 2. The value of $R_F$ 3 varies quite a bit (e.g., 25 to 30%) over process and temperature. Some of the process variations can be calibrated out, but temperature variations will continue to affect the gain and bandwidth of the TIA circuit 2. The bandwidth voltage, $V_{BW}$, which is applied to the gate of $M_{BW}$ 4, is a digitally-controlled signal that changes the effective bandwidth of the TIA circuit 2 by turning $M_{BW}$ 4 ON and OFF. When $M_{BW}$ 4 is turned ON, the TIA circuit 2 operates at a first data rate having a first bandwidth. When $M_{BW}$ 4 is turned OFF, the TIA circuit 2 operates at a second data rate having a second bandwidth.

The operation of $M_{DC}$ 5 is controlled by a direct current (DC) cancellation signal, $DC_{CAN}$, which is driven by a DC cancellation block (not shown for purposes of clarity). $M_{DC}$ 5 is operated in a manner that causes TIAOUT<0> and TIAOUT<1> to track one another by sinking the average input current through $M_{DC}$ 5. A replica of this average current is pushed into a fixed resistor to generate the AGC voltage signal, $V_{AGC}$, which turns ON $M_{AGC}$ 7. $M_{AGC}$ 7 turns ON stronger as the average input current increases and hence reduces the effective feedback resistance $R_F$ 3 and the gain of the TIA circuit 2 to allow it to handle a larger signal at the input where the TIA circuit 2 connects to a photodiode 8.

One of the disadvantages of the TIA circuit 2 and similar designs is that they have a limited dynamic range, and therefore are not capable of adequately handling input signals of varying OMA and $P_{avg}$. Another disadvantage of such TIA circuits is that while some of the process variations associated with variations in the value of $R_F$ can be removed through calibration, temperature variations that cause the value of $R_F$ to vary generally cannot be removed. Therefore, the performance of such TIA circuits can be detrimentally affected by temperature variations. Yet another disadvantage of such designs results from the operation of $M_{AGC}$ 7. The signal $V_{AGC}$ that controls the operations of $M_{AGC}$ 7 is an analog signal. When the value of $V_{AGC}$ is such that $M_{AGC}$ 7 is not turned fully ON or fully OFF, $M_{AGC}$ 7 operates in a nonlinear region, which can result in distortion in the output of the TIA circuit.

Accordingly, a need exists for a TIA circuit that has a wide dynamic range over multiple data rates, that has performance characteristics that are independent of temperature variations, and that avoids the aforementioned problems that can lead to distortion in the output of the TIA circuit.

SUMMARY OF THE INVENTION

The invention is directed to a TIA circuit and method. The TIA circuit includes at least a TIA and a bandwidth adjustment (BWA) circuit. The TIA has an input that receives an electrical signal generated by an optical detector in response to the optical detector converting an optical signal into the electrical signal. The TIA has an effective resistance that is adjustable to control the gain and bandwidth of the TIA circuit. The BWA circuit is electrically coupled with the TIA. The BWA circuit generates a BWA signal, which the BWA circuit uses to produce at least one drive signal that is output to the TIA. The TIA adjusts the effective resistance of the TIA based on the drive signal to control the gain and the bandwidth of the TIA circuit independently of any variations in temperature or process.

The method comprises:

providing a TIA circuit comprising a TIA and a bandwidth adjustment (BWA) circuit;

in the TIA, receiving an electrical current signal generated by an optical detector that converts an optical signal into the electrical current signal;

with the BWA circuit, generating a BWA signal;

in the BWA circuit, using at least the BWA signal to produce at least one drive signal and outputting the drive signal from the BWA circuit; and in the TIA, receiving the drive signal and adjusting an effective resistance of the TIA based on the drive signal to control a gain and a bandwidth of the TIA circuit.

These and other features and advantages of the invention will become apparent from the following description, drawings and claims.

DETAILED DESCRIPTION OF AN ILLUSTRATIVE EMBODIMENT

Figure 1:
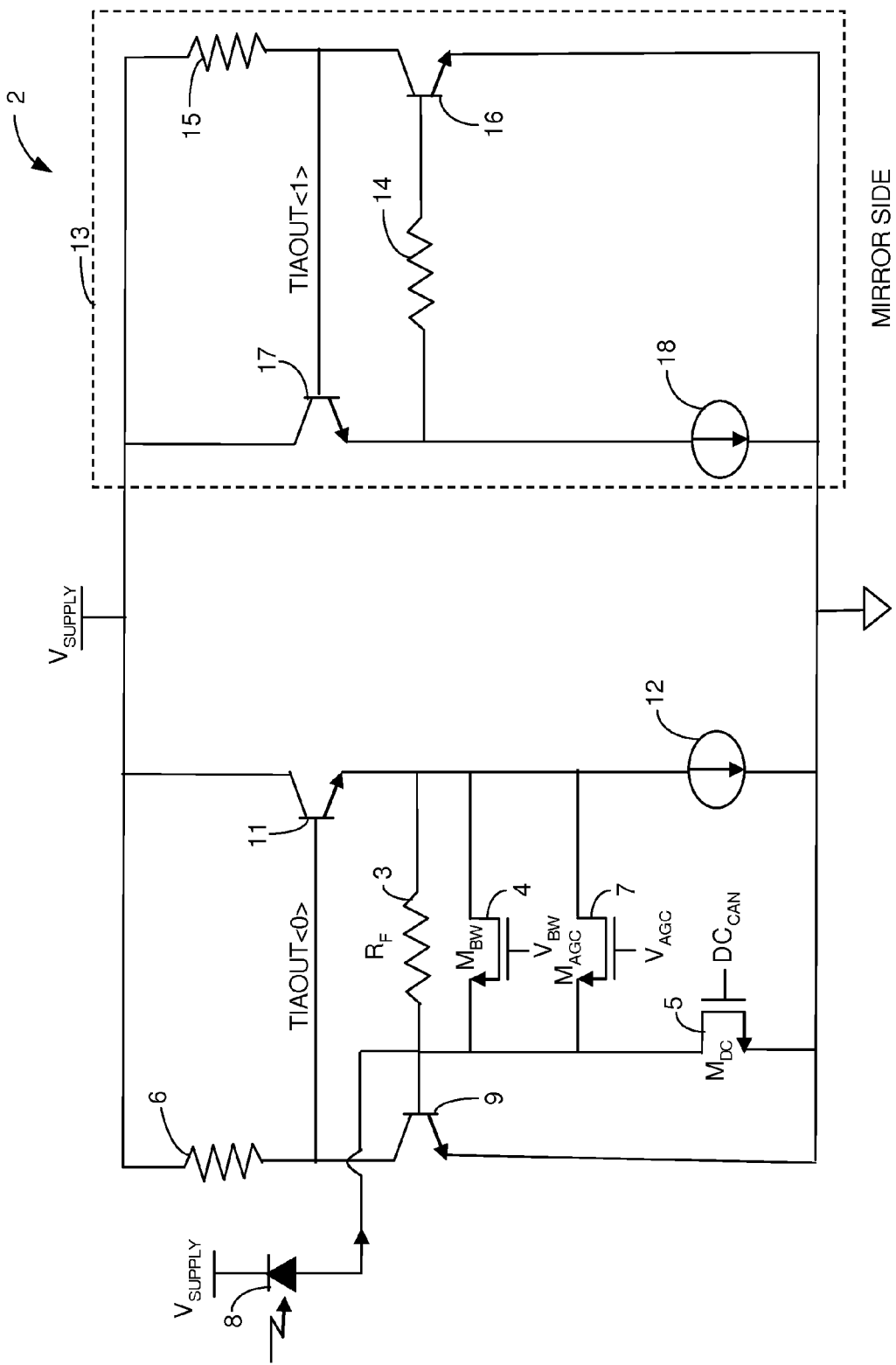
FIG. 1 is a block diagram of a known TIA circuit that has a known resistive feedback architecture.

In accordance with the invention, a TIA circuit is provided that merges the automatic gain control (AGC) function described above with the bandwidth adjustment (BWA) function described above to allow the TIA circuit to operate over a wide dynamic range and at multiple data rates. The TIA circuit has an effective resistance that is adjustable for adjusting the gain and the bandwidth of the TIA circuit. The mechanism of the TIA circuit that is used to adjust the effective resistance, and hence the gain and bandwidth of the TIA circuit, is temperature independent. Consequently, the performance of the TIA circuit is less detrimentally affected by temperature variations than known designs such as the aforementioned designs. Illustrative, or exemplary, embodiments of the method and apparatus will be described with reference to FIGS. 2-6, in which like reference numerals represent like elements, components or features.

Figure 2:
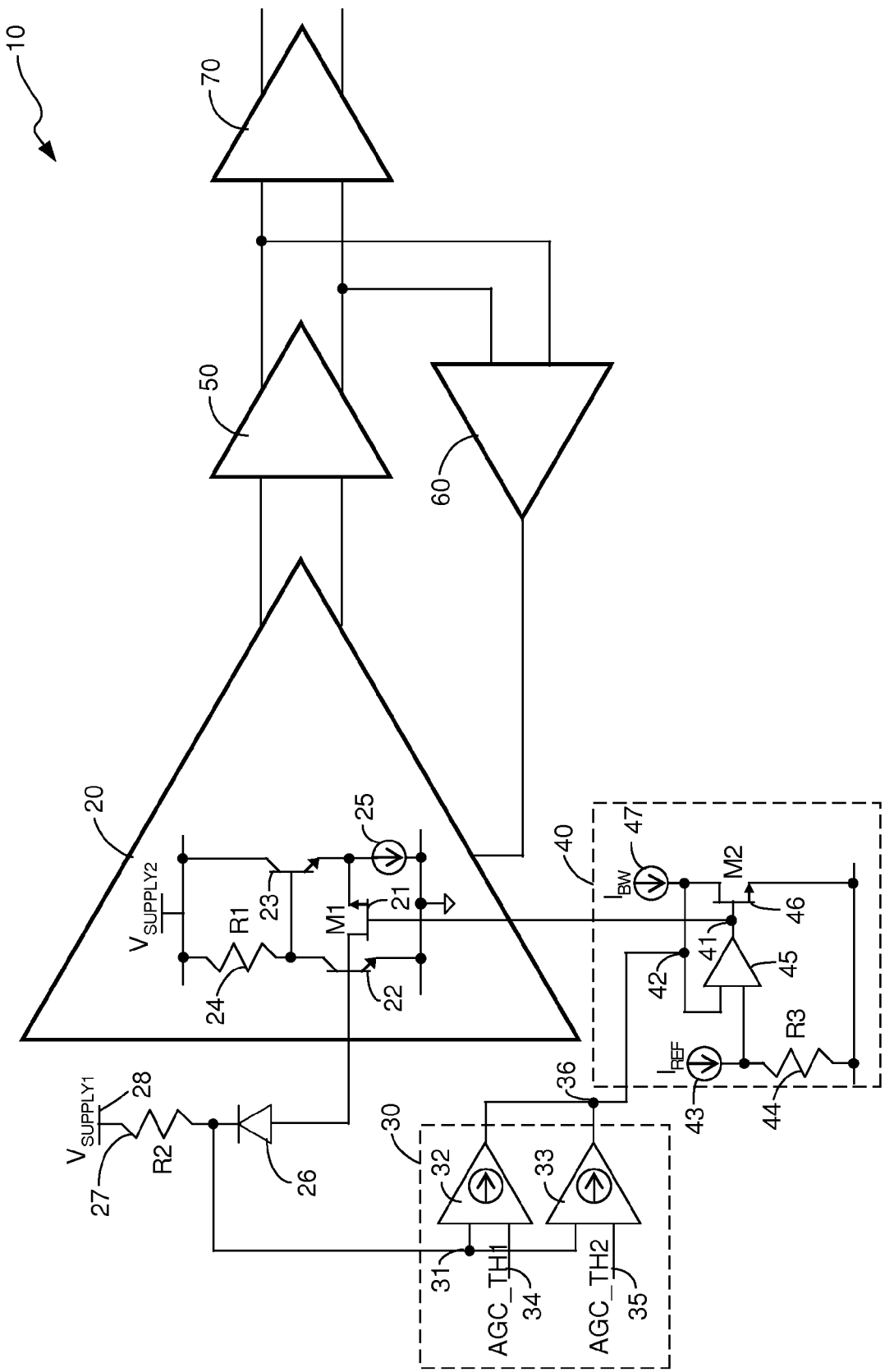
FIG. 2 illustrates a block diagram of a TIA circuit in accordance with an illustrative embodiment of the invention.

FIG. 2 is a block diagram of the TIA circuit 10 in accordance with an illustrative embodiment. The TIA circuit 10 includes a TIA 20, an AGC circuit 30 and a BWA circuit 40.

The TIA circuit 10 typically, but not necessarily, also includes a limiting amplifier 50, a DC cancellation circuit 60 and an output driver 70, although these components are outside of the scope of the discussion being provided herein. The discussion being provided herein focuses on the TIA 20, the AGC circuit 30 and the BWA circuit 40, which operate in conjunction with one another to allow the TIA circuit 10 to operate over a wide dynamic range with improved performance over temperature and process variations.

In accordance with this illustrative embodiment, the TIA 20 includes at least one MOSFET M1 21, first and second BJTs 22 and 23, a resistor R1 24, and a current source 25. The base of the BJT 22 is connected to the anode of an optical detector 26, which is typically, but not necessarily, a photodiode. For exemplary purposes, the optical detector 26 will be referred to hereinafter as a photodiode. A resistor R2 27 is connected to a cathode of the photodiode 26 and to a voltage supply 28. MOSFET M 21 has its drain connected to the base of BJT 22 and has its source connected to the emitter of BJT 23 and to a terminal of the current source 25. The collector of BJT 22 is connected to a terminal of the resistor R1 24 and to the base of BJT 23. The opposite terminal of resistor R1 24 is connected to the collector of BJT 23. The emitter of BJT 22 is connected to a terminal of the current source 25. The gate of MOSFET M1 21 is connected to an output terminal 41 of the BWA circuit 40, as will be described below in more detail.

The cathode of the photodiode 26 is connected to an input terminal 31 of the AGC circuit 30 such that the AGC circuit 30 senses an average input current, $I_{AVG}$, of the photodiode 26. The AGC circuit 30 includes first and second current sources 32 and 33, each of which has an input terminal that is connected to the input terminal 31 of the AGC circuit 30 for receiving the current signal generated by the photodiode 26 in response to the photodiode 26 detecting an optical signal. The first and second current sources 32 and 33 also have input terminals that receive first and second current threshold (TH) signals AGC_TH1 34 and AGC_TH2 35, respectively. AGC_TH1 34 is less than AGC_TH2 35.

If $I_{AVG}$ exceeds AGC_TH1 34, but is less than AGC_TH2 35, the first current source 32 outputs a first current signal having a first amplitude and the second current source 33 outputs no current signal. If $I_{AVG}$ exceeds AGC_TH1 34 and exceeds AGC_TH2 35, the first current source 32 outputs a first current signal having a first amplitude and the second current source 33 outputs a second current signal having a second amplitude. If $I_{AVG}$ is less than AGC_TH1 34 and less than AGC_TH2 35, the first and second current sources 32 and 33 output no current signals. The current signal(s) that are output by the first and second current sources 32 and 33 are summed at an output terminal 36 of the AGC circuit 30 to produce $I_{AGC}$. The output terminal 36 of the AGC circuit 30 is connected to an input terminal 42 of the BWA circuit 40. Thus, the current signal $I_{AGC}$ that is output from the AGC circuit 30 is injected into the BWA circuit 40.

Thus, if $I_{AVG}$ exceeds AGC_TH1, the AGC circuit 30 increases the amplitude of the current signal $I_{AGC}$ that is output from the AGC circuit and received by the BWA circuit 40 by a first amount. If $I_{AVG}$ exceeds AGC_TH2, the AGC circuit increases the amplitude of the output current signal $I_{AGC}$ that is output from the AGC circuit and received by the BWA circuit by a second amount. The second amount exceeds the first amount. Therefore, increasing the output current signal $I_{AGC}$ by the first amount results in a first reduction in the effective resistance of the TIA 20 and a first reduction in the gain of the TIA circuit 10. Increasing the output current signal $I_{AGC}$ by the second amount results in a second reduction in the effective resistance of the TIA 20 and a second reduction in the gain of the TIA circuit 10. Using the two threshold values to divide the operations of the AGC circuit 30 helps to optimize the performance of the TIA 20 for low, medium and high ranges of OMA and average power.

In accordance with this illustrative embodiment, the BWA circuit 40 includes a first current source 43, a resistor R3 44, an operational amplifier (Op Amp) 45, at least one MOSFET M2 46, and a second current source 47. The first and second current sources 43 and 47 are bandgap current sources (i.e., $V_{bg}/R$, where $V_{bg}$ is the bandgap voltage and R is the resistor), and as such have operating characteristics that are temperature-independent. The first current source 43 generates a reference current, $I_{REF}$, which passes through resistor R3 44 to create a reference voltage, $V_{REF}$, across resistor R3 44, which is process and temperature independent. The second current source 47 generates a BWA current, $I_{BW}$, which passes through M2 46 from its drain to its source when M2 46 is turned ON by Op Amp 45. The drain-to-source voltage of M2 46 is referred to herein as $V_{ds}$.

During operation of the BWA circuit 40, $V_{REF}$ and $V_{ds}$ remain equal to one another. As the amount of current that is injected into the BWA circuit 40 from the AGC circuit 30 is varied based on the outputs of the current sources 32 and 33 of the AGC circuit 30, Op Amp 45 drives the gate of M2 46 in such a way that the values of the voltage signals being applied to the input terminals of the Op Amp 45 remain approximately equal. Because $V_{REF}$ is temperature-independent, $V_{ds}$, which is maintained equal to $V_{REF}$, is also temperature-independent. For this reason, the output signal of the BWA circuit 40 at terminal 41 of the BWA circuit 40 generates a voltage so as to produce a temperature-independent resistance at MOSFET M2 46. The output signal of the BWA circuit 40 at terminal 41 is driven to achieve temperature independence at $V_{ds}$ of MOSFET M2 46, which then achieves temperature independence for the effective feedback resistance of the TIA 20 due to the matching characteristics of MOSFETs M2 46 and M1 21. The output signal at terminal 41 varies with temperature to achieve this result.

The output signal of the BWA circuit 40 at terminal 41 is used as an input signal to the TIA 20 for driving the gate of M1 21 of the TIA 20. The manner in which the gate of M1 21 is driven controls the effective feedback resistance of the TIA 20, which controls the gain and the bandwidth of the TIA circuit 10. The larger the current signal that is injected into the BWA circuit 40 by the AGC circuit 30 at node 42, the greater the reduction in the gain of the TIA 20. Conversely, the smaller the current signal that is injected into the BWA circuit 40 by the AGC circuit 30 at node 42, the smaller the reduction in the gain of the TIA 20.

In addition, because the output signal at terminal 41 of the BWA circuit 40 is designed to generate a temperature-independent resistance of MOSFET M2 46 which matches MOSFET M1 21, the gain and the bandwidth of the TIA circuit 10 have less temperature dependence than they would without the use of the invention. In other words, the gain and the bandwidth of the TIA circuit 10 are relatively constant over temperature. Furthermore, the configuration of the TIA circuit 10 obviates the problem described above with reference to FIG. 1 caused by $M_{AGC}$ 7 operating in the nonlinear region, leading to distortion in the output of the TIA circuit 2. In the TIA circuit 2 shown in FIG. 1, the signal $V_{AGC}$ that drove the gate of MAGC 7 was an analog signal that could leave $M_{AGC}$ 7 barely OFF or barely ON, resulting in MAGC 7 operating in nonlinear regions. Unlike the TIA circuit 2 shown in FIG. 1, in accordance with the illustrative embodiment shown in FIG. 2, a separate MOSFET is not used for performing AGC. Rather, M1 21 is used for AGC and BWA, as these functions have now been merged. Therefore, a separate MOSFET is not being turned ON and OFF to perform AGC, and therefore is never operating in its nonlinear region. Rather than using a separate MOSFET for this purpose, the amount of current that is into the input terminal 42 of the BWA circuit 40 is varied. Thus, the problem of distortion in the TIA output due to nonlinear operation of the AGC MOSFET is eliminated. This feature provides the TIA circuit 10 with a wide dynamic range, without nonlinear effects from the AGC circuit 30, as well as temperature independence.

Figure 3:
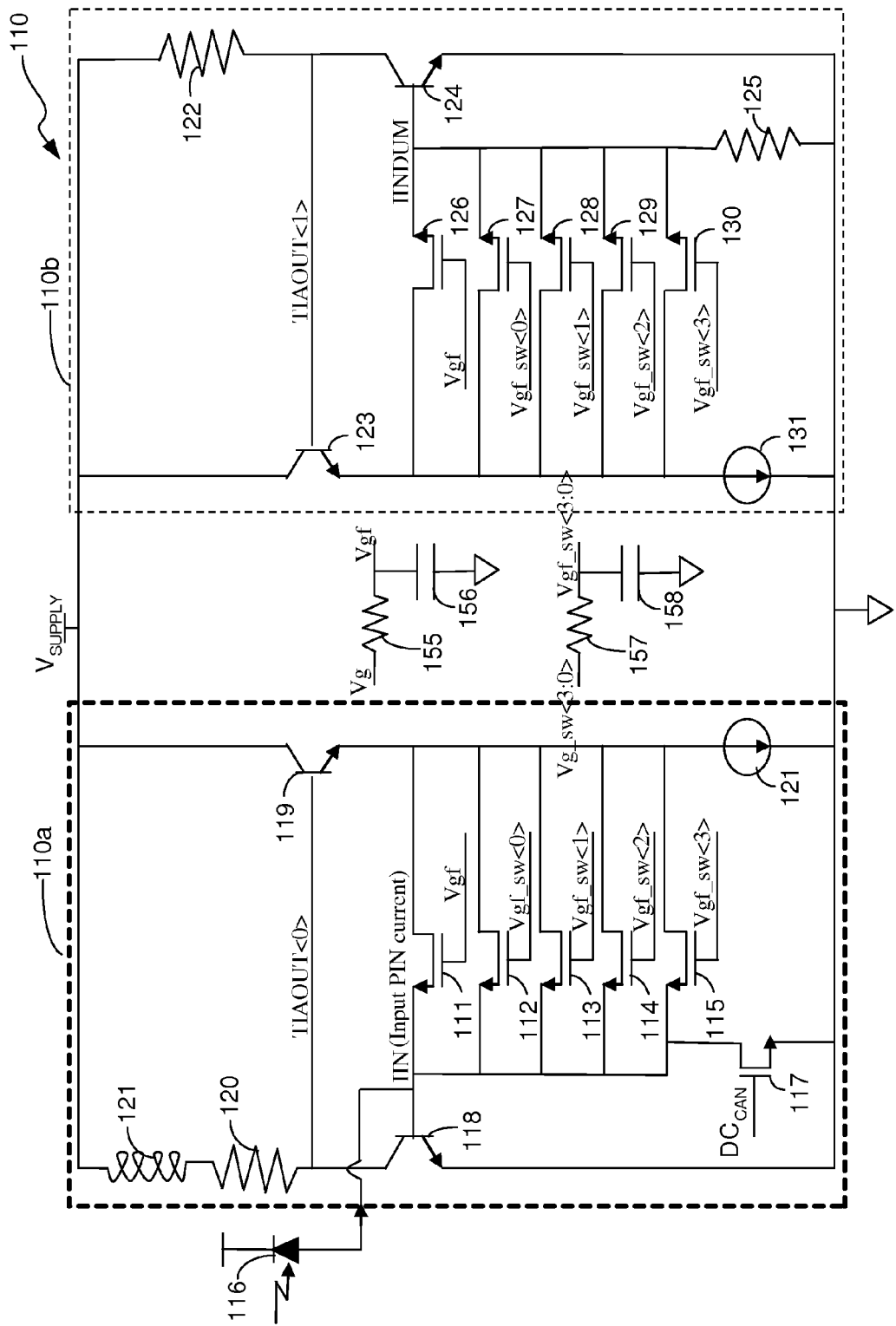
FIG. 3 illustrates a block diagram of a TIA of a TIA circuit in accordance with another illustrative embodiment.
Figure 4:
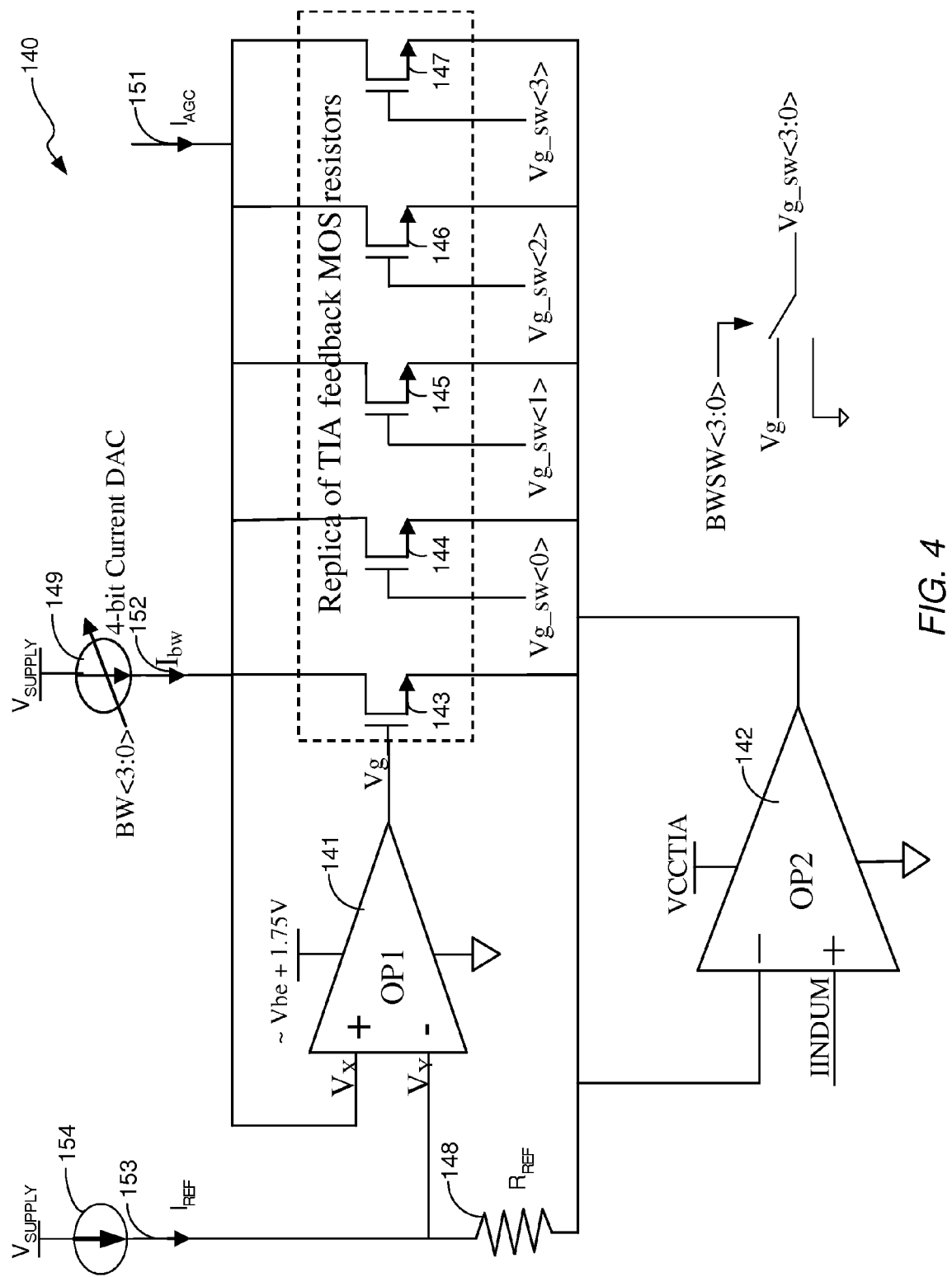
FIG. 4 illustrates a block diagram of a bandwidth adjustment (BWA) circuit that is used in conjunction with the TIA shown in FIG. 3.
Figure 5:
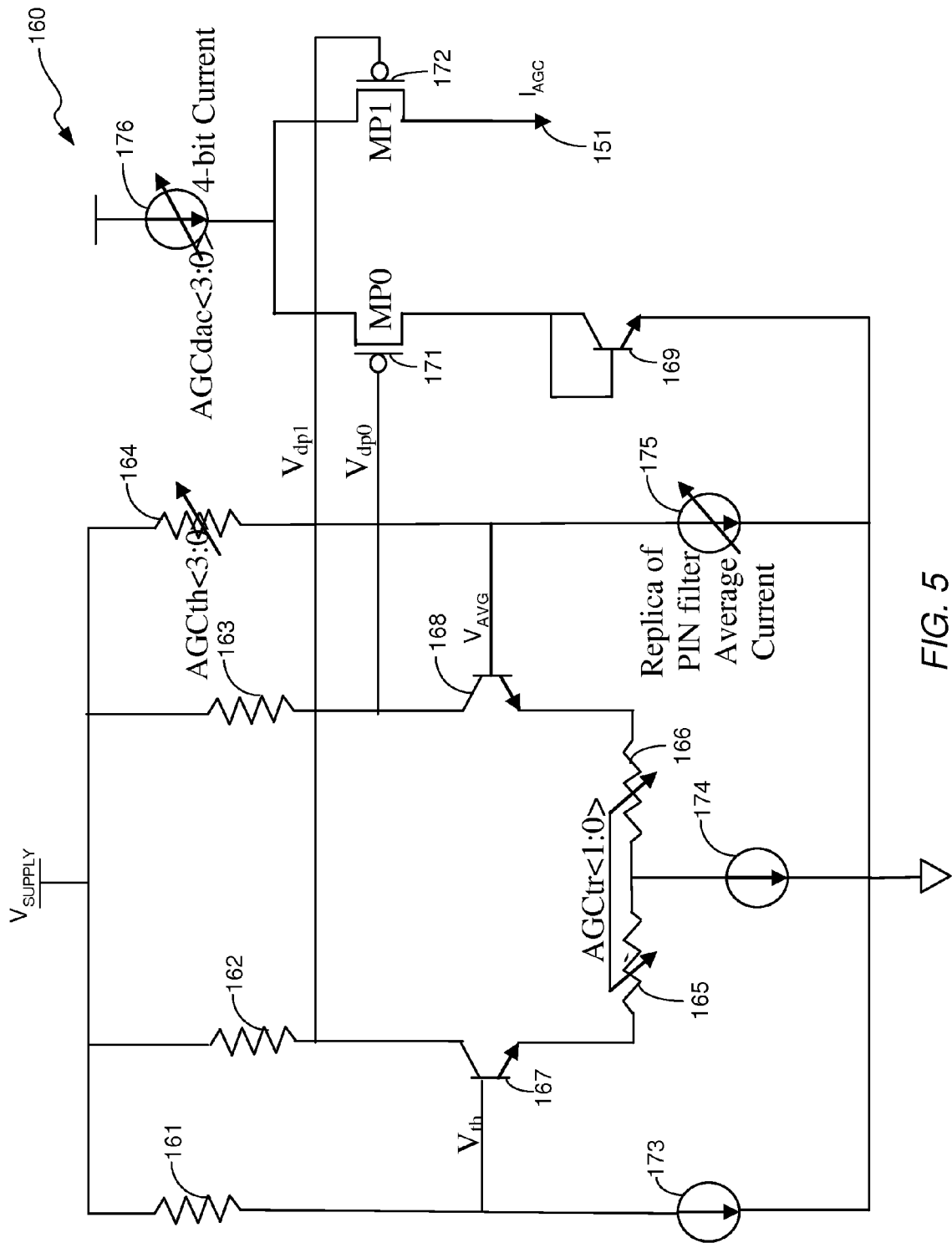
FIG. 5 illustrates a block diagram of an automatic gain control (AGC) circuit that is used in conjunction with the TIA shown in FIG. 3 and with the BWA circuit shown in FIG. 4.

A TIA circuit that implements the principles and concepts described above with reference to FIG. 2 may have a variety of configurations. For example, another illustrative embodiment of a TIA circuit that implements the principles and concepts of the invention is shown in FIGS. 3-5. FIG. 3 illustrates a block diagram of the TIA 110 of the TIA circuit. FIG. 4 illustrates a block diagram of a BWA circuit 140 of the TIA circuit. FIG. 5 illustrates a block diagram of an AGC circuit 160 of the TIA circuit. The TIA circuit in accordance with this illustrative embodiment will now be described with reference to FIGS. 3-5.

The TIA 110 (FIG. 3) has a real side 110a and a dummy side 110b. On the real side 110a, a plurality of MOSFETs 111-115 are in parallel with one another. An optical detector 116, which is referred to hereinafter as a photodiode for exemplary purposes, is electrically coupled to a node of the TIA 110 that is electrically coupled to the sources of the MOSFETs 111-115. That same node is also electrically coupled to the drain of a MOSFET 117 and to the bases of BJT 118. The gate of the MOSFET 117 receives a DC cancellation signal, $DC_{CAN}$, that is output from a DC cancellation circuit (not shown for purposes of clarity). The DC cancellation circuit is outside of the scope of this invention and therefore is not shown or described herein.

The collector of the BJT 118 is electrically coupled to a terminal of a resistor 120. The opposite terminal of the resistor 120 is electrically coupled to a terminal of an inductor 121. The emitter of the BJT 118 is electrically coupled to the source of MOSFET 117 and to a terminal of a current source 121. The opposite terminal of the current source 121 is electrically coupled to the emitter of BJT 119. The collector of BJT 119 is electrically coupled to a terminal of the inductor 121.

The dummy side 110b of the TIA 110 includes a resistor 122, BJTs 123 and 124, a resistor 125, MOSFETs 126-130, and a current source 131, which are coupled together in a manner similar to the manner in which analogous components of the real side 110a are coupled together. The output of the real side 110a of the TIA 110 is TIAOUT<0> and the output of the dummy side 110b of the TIA 110 is TIAOUT<1>. The MOSFETs 111-115 provide the feedback resistance of the TIA 110, and the feedback resistance is altered by changing the gate voltage of one or more of the MOSFETs 111-115, as will be described below in more detail.

The BWA circuit 140 (FIG. 4) includes first and second Op Amps 141 and 142, a plurality of MOSFETs 143-147 connected in parallel with one another, a reference resistor, $R_{REF}$, 148, a digital-to-analog converter (DAC) current source 149, and a fixed current source 154. The current sources 149 and 154 are bandgap current sources, and as such have operating characteristics that are temperature-independent. The MOSFETs 143-147 are exact replicas of the MOSFETs 111-115 (FIG. 3). As will be described below in more detail, the gate voltage of one or more MOSFETs 111-115 and 143-147 is varied to change the effective resistances provided by each of the parallel arrangements. The control signals Vgf and Vgf_sw<3:0> that are used to switch on the MOSFETs 111-115 are derived from the control signals Vg and Vg_sw<3:0>, respectively, that are used to switch on the MOSFETs 143-147, as will be described below in more detail. Filter circuitry represented by elements 155-158 (FIG. 3) shows how the control signals Vgf and Vgf_sw<3:0> are derived from the control signals Vg and Vg_sw<3:0>, respectively. The current signal $I_{AGC}$ 151 that is injected into the drains of the MOSFETs 143-147 is an output of the AGC circuit 160 shown in FIG. 5. The current signal $I_{BW}$ 152 is a programmable current signal that is generated by the DAC current source 149. The current signal $I_{REF}$ 153 is a fixed current signal that is generated by the current source 154.

The AGC circuit 160 (FIG. 5) includes three fixed resistors 161-163, three variable resistors 164-166, three BJTs 167-169, two MOSFETs 171 and 172, two fixed current sources 173 and 174, and two variable current sources 175 and 176. The variable resistor 164 is used to set a first average power threshold, AGCth. The combination of the variable resistors 165 and 166 is used to set the range of OMA over which AGC transition, AGCtr, takes place. There are two of such AGC circuits 160 implemented in the design which are used to adjust the gain of the TIA circuit in two stages (giving two threshold levels AGCth1 and AGCth2) based on the average current, $I_{AVG}$, of the current signal produced by the photodiode 116 (FIG. 3), as will be described below in more detail. The variable current source 175 is a replica of the average current output by the photodiode 116 (FIG. 3). Variable current source 176 is a DAC current source that is programmable such that it can be set to achieve a desired value for current signal $I_{AGC}$ 151.

The combined circuitry of the TIA 110, the BWA circuit 140 and the AGC circuit 160 forms the TIA circuit of this embodiment. The manner in which the TIA circuit operates will now be described with reference to FIGS. 3-5. In accordance with this illustrative embodiment, the TIA circuit is configured for multi-data rate operations (e.g., 4 Gigabits per second (Gbps) to 14 Gbps) over a wide dynamic range of OMA (e.g., −8 decibel milliwatt (dBm) to 7 dBm) and ER (e.g., 3 dB to 11 dB) while maintaining very good performance characteristics that are not detrimentally affected by variations in temperature. The TIA circuit has multi-data rate functionality achieved by adjusting the feedback resistance of the TIA 110 (FIG. 3) to attain the desired bandwidth. The DAC current source 149 (FIG. 4) has 4-bit control for adjusting the current $I_{BW}$ 152 to achieve the bandwidth adjustment.

The photodetector 116 generates an output signal with a current modulation amplitude (CMA), which is known to be correlated to $I_{AVG}$ within a fixed range. For overload (high CMA and high $I_{AVG}$) operation, the AGC circuit 160 reduces the gain of the TIA circuit by a certain ratio to allow it to handle higher input CMA without saturating the TIA circuit. The DAC current source 176 (FIG. 5) has 4-bit control for setting the current that is injected into the sources of the MOSFETs 171 and 172 for achieving the desired gain reduction ratio. The AGC circuit 160 monitors $I_{AVG}$ associated with the current signal produced by the photodiode 116 and begins reducing the TIA gain as soon as $I_{AVG}$ exceeds the 4-bit programmable threshold AGCth provided by variable resistor 164 (FIG. 5). A smaller reduction in the TIA gain is achieved for a medium range of OMA (e.g., one-half of the TIA gain for an OMA ranging from −6 dBm to −2 dBm). A larger reduction in TIA gain is achieved for higher OMA (e.g., one-third of the TIA gain for an OMA that is equal to or greater than −1 dBm). The range of OMA over which the AGC transition takes place is also programmable through two-bit control (0.5 dB-2 dB) of the variable resistor combination 165/166 (FIG. 5) to set the threshold AGCtr.

With reference to the BWA circuit 140 (FIG. 4), the fixed voltage $V_{REF}=I_{REF}$ 153×$R_{REF}$ 148 is replicated as Vds of the MOSFETs 143-147. In the closed loop, Op Amp 141 changes the gate voltage, Vg, of MOSFET 143 in order to force the input voltages $V_X$ and $V_Y$ of the Op Amp 141 to be equal: $V_X=V_Y$. As the known current $I_{BW}$ 152 is pushed into the drains of the MOSFETs 143-147, Op Amp 141 changes Vg and hence the effective resistance provided by the MOSFETs 143-147 such that the voltage Vds across MOSFETs 143-147 is equal to $V_{REF}$. Thus, the effective resistance provided by the MOSFETs 143-147 is equal to $R_{REF}$/n, where n is the ratio of $I_{BW}$ and $I_{REF}$ in the BWA circuit 140. The same control signal Vg (filtered) that is used to bias the MOSFETs 143-147 (FIG. 4) is used to bias the MOSFETs 111-115 (FIG. 3). Because the closely-matched MOSFETs 111-115 and 143-147 have the same Vgs, $R_{REF}$/n of the BWA circuit 140 is replicated in the TIA 110 by turning ON the respective MOSFETs 111-115 in the TIA 110 to provide the TIA 110 with an effective feedback resistance that is equal to $R_{REF}$/n. Thus, by changing the current $I_{BW}$ 152 generated by the DAC current source 149 (controlled by BW<3:0>), the effective feedback resistance of the TIA 110 is changed, thereby changing the gain and bandwidth of the TIA circuit.

For example, assuming $T_{REF}$=25 microampere (μA), $R_{REF}$=4 kilo-ohm and $I_{BW}$=250 μA, the effective feedback resistance of the TIA 110 (FIG. 3) is equal to about 400 ohm. Process variations can be calibrated out during wafer testing by targeting a certain resistance and setting BW<3:0> (FIG. 4) to generate a current signal $I_{BW}$ 152 that achieves the targeted resistance. Because the effective feedback resistance of the TIA 110 (FIG. 3) tracks $R_{REF}$ 148 of the BWA circuit 140 (FIG. 4), which does not vary much with variations in temperature for the reasons described above, the gain of the TIA 110 does not vary much if at all with variations in temperature.

For AGC operation, the reduction in gain is achieved by pushing more of the current $I_{AGC}$ 151 (FIGS. 4 and 5) into MOSFETs 143-147 once threshold AGCth is exceeded. The control signal BWSW<3:0> (FIG. 4) controls the effective size of the MOSFET associated with MOSFETs 143-147 by turning them ON or OFF such that they can handle the maximum current $I_{AGC}$ 151 without railing Vg (~Vbe +1.75V). This rail voltage is limited to prevent the MOSFETs 143-147 from becoming overstressed. On the other hand, if the MOSFETs 143-147 are made arbitrarily large, this will lower $V_{dsat}$ ($V_{gs}-V_{th}$) of the MOSFETs 143-147 for normal operation (low OMA), which means that $V_{dsat}$ of the MOSFETs 111-115 (FIG. 3) will also be lowered. If the voltage swing across the MOSFETs 111-115 (FIG. 3) is so large as to be comparable to $V_{dsat}$, this will cause distortion in the output of the TIA 110. The control signal BWSW<3:0> (FIG. 4) is set to prevent such occurrences.

With reference to FIG. 3, the DC Cancellation circuit (not shown) that provides the control signal $DC_{CAN}$ that drives the gate of MOSFET 117 (FIG. 3) causes the MOSFET 117 to sink the input average current from the photodiode 116 such that the average values of TIAOUT<0> and TIAOUT<1> track one another and such that the input current to the TIA 110, IIN, and the input current on the dummy side 110b generated by the resistor 125, IINDUM, track one another. Op Amp 142 (FIG. 4) buffers IINDUM and $V_{REF}$ is applied on top of it in order to set the source voltage of the MOSFETs 143-147 similar to the source voltage of MOSFETs 111-115 and MOSFETs 126-130.

In the AGC circuit 160 (FIG. 5), as the input average current increases and after a certain threshold (set by AGCth<3:0>) has been exceeded, $V_{AVG}$ goes below $V_{th}$ and $V_{dp1}$ starts to drop below $V_{dp0}$. This starts turning ON MOSFET MP1 172, which causes the current generated by the DAC current source 176 to be steered into the branch that includes MP1 172 and into the BWA circuit 140 ($I_{AGC}$). This additional current causes Vg to rise and to reduce the effective feedback resistance and gain of the TIA 110 to handle overload operation. Continuing with the above example, if $I_{AGC}$=250 µA, the total current injected into the MOSFETs 143-147 is equal to 500 µA, which results in an effective TIA feedback resistance of approximately 200 ohm, provided Vg does not rail.

The transition of the AGC is controlled by changing the gain of the first differential pair (BJTs 167 and 168) in the AGC circuit 160 by changing the value of the degeneration resistors 165 and 166. Bits AGCtr<1:0> control this transition. As explained above, the AGC circuit 140 has two power threshold levels, namely AGCth1 and AGCth2. This allows the gain of the TIA 110 to be gradually decreased in two steps as the input power increases. This is important because if the AGC circuit 160 causes too much of a reduction in the TIA gain for medium range of OMA, the bandwidth will be pushed too high and ringing may be observed at the TIA output due to reduced phase margin. Using the two thresholds to control the TIA gain transitions causes the lower phase margin to occur when the TIA output signal voltage modulation amplitude (VMA) is large enough to tolerate the increased ringing and low enough to prevent non-linear effects in the TIA 110.

An alternative to using this approach to obtain a gradual reduction in TIA gain as the input power increases is to use a replica/scaled version of input average current to drive the MOSFET differential pair 171 and 172 (FIG. 5) in the AGC circuit 160 (FIG. 5) instead of the 4-bit DAC current source 176. Although this technique is not implemented in the presented design, the replica variable current source 175 represents such an alternative.

The BWA circuit 140 (FIG. 4) achieves better control and less variation of bandwidth and gain of the TIA 110 (FIG. 3) over process and temperature. The AGC circuit 160 (FIG. 5) guarantees a well-defined threshold above which it begins reducing the gain of the TIA 110. The programmability with which the amount of gain reduction is selected via the 4-bit DAC current source 176 (FIG. 5) helps to optimize the AGC circuit 160 for different data-rates and input operating ranges. In addition, dividing the operation of the AGC circuit 160 into multiple levels (two levels in this embodiment) by using multiple TH values helps to optimize the performance of the TIA 110 for low, medium and high ranges of input OMA and average power. Programmability on the degeneration resistors 165 and 166 (FIG. 5) in the BJT differential pair 167, 168 helps control the transition period in terms of input OMA during operation of the AGC circuit 160.

Figure 6:
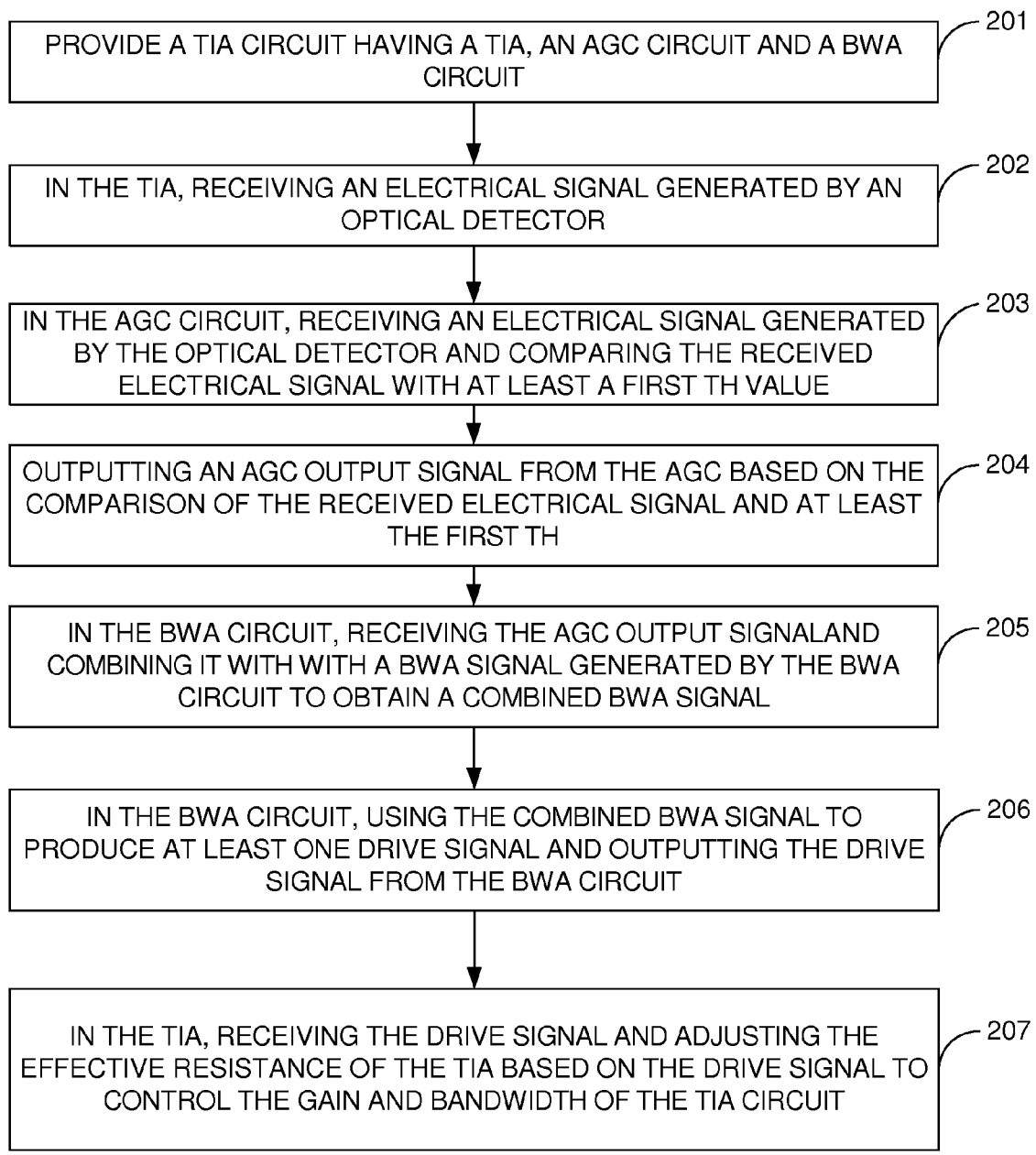
FIG. 6 illustrates a flow diagram of the method performed by the TIA circuit in accordance with an illustrative embodiment.

FIG. 6 illustrates a flow diagram that represents the method performed by the TIA circuit in accordance with an illustrative embodiment. As indicated by block 201, a TIA circuit comprising a TIA, an AGC circuit and a BWA circuit is provided. In the TIA, an electrical signal generated by an optical detector is received, as indicated by block 202. In the AGC circuit, an electrical signal generated by the optical detector is received and compared with at least a first threshold value, as indicated by block 203. The AGC circuit outputs an AGC output signal that is based at least on the comparison of the received electrical signal with at least the first threshold value, as indicated by block 204. In the BWA circuit, the AGC output signal is received and combined with a BWA signal generated by the BWA circuit to obtain a combined signal, as indicated by block 205. In the BWA circuit, the combined signal is used to produce at least one drive signal that is outputted from the BWA circuit, as indicated by block 206. In the TIA, the drive signal is received and an effective resistance of the TIA is adjusted based on the drive signal to control the gain and the bandwidth of the TIA circuit, as indicated by block 207.

Many modifications may be made to the illustrative embodiments described above that are within the scope of the invention. For example, while the TIAs 20 and 110 have been described as having effective resistances that are temperature independent, in some cases it may be desirable to allow the effective resistance to vary with temperature in a manner that is controllable. This can be accomplished by, for example, using a temperature coefficient with the current source $I_{REF}$ 43 or with the current source $I_{BW}$ 47 that is deliberately set to achieve a desired amount of variation in the effective resistance of the TIA 20 with variations in temperature.

Another example of modifications that may be made to the illustrative embodiments is related to the manner in which thresholds are used in the AGC circuits 30 and 160 to achieve the above-described gain transitions. While the operations of these circuits have been described with reference to comparing current signals produced by the photodiodes with corresponding threshold values, thresholding may instead be performed my monitoring signal swings at the output of the TIA. In the latter case, the threshold values used would be VMA threshold values. Both ways have advantages and disadvantages. It is also possible to use both types of thresholding techniques together. Also, while the comparisons have been described with reference to comparing current signals with threshold values, the comparisons may instead involve comparing voltage signals with threshold values.

It should also be noted that the TIA circuit need not always include an AGC circuit. There are benefits to having a TIA circuit that includes the TIA and the BWA circuit, but that does not include the AGC circuit. In the latter case, the gain and the bandwidth of the TIA would be controlled by the BWA circuit, which would use the BWA signal, which is $I_{BW}$ in the illustrative embodiments, to produce the drive signal that is then used to vary the effective resistance of the TIA.

It should be noted that the invention has been described with respect to illustrative embodiments for the purpose of describing the principles and concepts of the invention. The invention is not limited to these embodiments. For example, the TIA circuits described with reference to FIGS. 2-6 are merely examples of suitable configurations that demonstrate the principles and concepts of the invention. As will be understood by those skilled in the art in view of the description being provided herein, many modifications may be made to the embodiments described herein without deviating from the goals of the invention, and all such modifications are within the scope of the invention.

What is claimed is:

1. A transimpedance amplifier (TIA) circuit comprising:
   a TIA having at least one TIA input and at least one TIA output, the TIA input receiving an electrical signal generated by an optical detector in response to the optical detector converting an optical signal into the electrical signal, the TIA having an effective resistance that is adjustable, the TIA output outputting a TIA output signal; and
   a bandwidth adjustment (BWA) circuit electrically coupled with the TIA, the BWA circuit generating a BWA signal, and wherein the BWA circuit uses the BWA signal to produce at least one drive signal that is output to the TIA, and wherein the TIA adjusts the effective resistance of the TIA based on said at least one drive signal to control a gain and a bandwidth of the TIA circuit.

2. The TIA circuit of claim 1, further comprising:

an automatic gain control (AGC) circuit electrically coupled to the optical detector and to the BWA circuit, the AGC circuit being configured to receive an electrical signal produced in response to an optical signal coupled to the optical detector and to compare the electrical signal received in the AGC circuit with at least a first threshold (TH) value, and wherein the AGC circuit outputs an AGC output signal that is based at least on the comparison of the electrical signal received in the AGC circuit with at least the first TH value, and wherein the BWA circuit receives the AGC output signal and combines the AGC output signal with the BWA signal to produce a combined signal, and wherein the BWA circuit uses the combined signal to produce said at least one drive signal.

3. The TIA circuit of claim 2, wherein if the electrical signal received in the AGC circuit exceeds the first TH value, the AGC circuit changes a magnitude of the AGC output signal, and wherein the changed magnitude AGC signal results in a reduction in the effective resistance of the TIA and a reduction in the gain of the TIA circuit.

4. The TIA circuit of claim 2, wherein the AGC circuit is configured to compare the electrical signal received in the AGC circuit with at least the first TH value and with a second TH value, and wherein the AGC output signal is based at least on the comparisons of the electrical signal with the first and second TH values.

5. The TIA circuit of claim 4, wherein the first TH value is less than the second TH value, and wherein if the electrical signal received in the AGC circuit exceeds the first TH value, the AGC circuit changes a magnitude of the AGC output signal by a first amount, and wherein if the electrical signal received in the AGC circuit exceeds the second TH value, the AGC circuit further changes the magnitude of the AGC output signal by a second amount.

6. The TIA circuit of claim 5, wherein the AGC output signal changed by the first amount results in a first reduction in the effective resistance of the TIA and a first reduction in the gain of the TIA circuit, and wherein the AGC output signal increased by the second amount results in a second reduction in the effective resistance of the TIA and a second reduction in the gain of the TIA circuit, and wherein the effective resistance of the TIA and the gain of the TIA circuit after the second reduction are less than the effective resistance of the TIA and the gain of the TIA circuit, respectively, after the first reduction.

7. The TIA circuit of claim 2, wherein the BWA signal is a BWA current signal, and wherein the BWA circuit includes a first current source that generates the BWA signal, and wherein the first current source is a variable digital-to-analog converter (DAC) current source.

8. The TIA circuit of claim 7, wherein the BWA circuit also includes a fixed current source for generating a reference current $I_{REF}$, and wherein the fixed current source and the variable DAC current source have well controlled temperature variation.

9. The TIA circuit of claim 1, wherein the TIA has a resistive-feedback architecture that includes:

a first set of metal oxide semiconductor field effect transistors (MOSFETs) electrically connected in parallel with one another such that the sources of the MOSFETs are electrically tied together and the drains of the MOSFETs are electrically tied together, wherein said at least one drive signal includes a first set of control signals that are applied to gates of the MOSFETs for turning the MOSFETs ON and OFF, wherein MOSFETs of the first set of MOSFETs that are turned ON provide the TIA with the effective resistance, and wherein the gain and bandwidth of the TIA are varied by varying a gate voltage of one or more turned ON MOSFETs of the first set of MOSFETs to thereby vary the effective resistance of the TIA.

10. The TIA circuit of claim 1, wherein the effective resistance of the TIA is controlled in such a way that the bandwidth of the TIA circuit is selectable between at least first and second bandwidths to provide multi-data rate operations of the TIA circuit.

11. A transimpedance amplifier (TIA) circuit comprising:

a TIA having at least one TIA input and at least one TIA output, the TIA input receiving an electrical current signal generated by an optical detector in response to the optical detector converting an optical signal into the electrical current signal, the TIA having a first set of n metal oxide semiconductor field effect transistors (MOSFETs) electrically connected in parallel with one another such that the sources of the MOSFETs are electrically tied together and the drains of the MOSFETs are electrically tied together, where n is a positive integer that is equal to or greater than 2, and wherein a first set of n control signals are applied to gates of the MOSFETs for turning the MOSFETs ON and OFF, wherein MOSFETs of the first set of MOSFETs that are turned ON provide the TIA with an effective resistance, and wherein the TIA has a gain and a bandwidth that can be varied by changing the effective resistance by changing a gate voltage of one or more turned ON MOSFETs of the first set of MOSFETs, the TIA output outputting a TIA output signal; and a bandwidth adjustment (BWA) circuit electrically coupled with the TIA, the BWA circuit having at least one variable current source that generates a BWA current signal, $I_{BW}$, and wherein the BWA circuit uses the current signal $I_{BW}$ to produce a first set of drive signals that are applied to respective gates of the MOSFETs of the first set of MOSFETs to control a gate-to-source voltage of the MOSTFETs of the first set to thereby control the effective resistance of the TIA, wherein controlling the effective resistance of the TIA controls a gain and a bandwidth of the TIA circuit.

12. The TIA circuit of claim 11, further comprising:

an automatic gain control (AGC) circuit electrically coupled to the optical detector, the AGC circuit being configured to monitor an average current, $I_{AVG}$ associated with the electrical current signal generated by the optical detector and to compare the average current $I_{AVG}$ with at least a first threshold (TH) value, and wherein the AGC circuit outputs an output current signal, $I_{AGC}$, that is based at least on the comparison of $I_{AVG}$ with at least the first TH value, and wherein the BWA circuit receives the current signal $I_{AGC}$ and combines the current signal $I_{AGC}$ with the current signal $I_{BW}$ and uses the combined current signal to produce said first set of drive signals.

13. The TIA circuit of claim 12, wherein if the average $I_{AVG}$ exceeds the first TH value, the AGC circuit increases the output current signal $I_{AGC}$ that is output from the AGC circuit and received by the BWA circuit, and wherein the increased current signal $I_{AGC}$ results in a reduction in the effective feedback resistance of the TIA and reduction in the gain of the TIA circuit.

14. The TIA circuit of claim 12, wherein the AGC circuit is configured to compare the average current $I_{AVG}$ with at least the first TH value and with a second TH value, and wherein the AGC circuit outputs an output current signal, $I_{AGC}$, that is based at least on the comparisons $I_{AVG}$ with at least the first and second TH values, respectively.

15. The TIA circuit of claim 14, wherein the first TH value is less than the second TH value, and wherein if the average $I_{AVG}$ exceeds the first TH value, the AGC circuit increases the output current signal $I_{AGC}$ that is output from the AGC circuit and received by the BWA circuit by a first amount, and wherein if the average current $I_{AVG}$ exceeds the second TH value, the AGC circuit increases the output current signal $I_{AGC}$ that is output from the AGC circuit and received by the BWA circuit by a second amount, wherein $I_{AGC}$ after the second amount is added is larger than $I_{AGC}$ after the first amount is added.

16. The TIA circuit of claim 15, wherein the output current signal $I_{AGC}$ increased by the first amount results in a first reduction in the effective resistance of the TIA and a first reduction in the gain of the TIA circuit, and wherein the output current signal $I_{AGC}$ increased by the second amount results in a second reduction in the effective resistance of the TIA and a second reduction in the gain of the TIA circuit, and wherein the effective resistance of the TIA and the gain of the TIA circuit are less than the effective resistance of the TIA and the gain of the TIA circuit, respectively, after the first reduction.

17. The TIA circuit of claim 11, wherein the BWA circuit further comprises:
a second set of n MOSFETs electrically connected in parallel with one another such that the sources of the MOSFETs of the second set are electrically tied together and the drains of the MOSFETs of the second set are electrically tied together, and wherein a second set of drive signals are applied to respective gates of the MOSFETs of the second set for turning the MOSFETs of the second set ON and OFF, wherein MOSFETs of the second set that are turned ON provide the BWA circuit with an effective resistance that is proportional to a resistor ($R_{REF}$) in the BWA circuit, and wherein the first set of drive signals is derived from the second set of drive signals by passing the second set of drive signals through a filter, and wherein the MOSFETs of the first and second sets have physical and electrical attributes that are closely matched, and wherein if MOSFETs of the second set are turned ON by the respective drive signals of the second set, respective MOSFETs of the first set are also turned ON by the respective drive signals of the first set, and wherein if MOSFETs of the second set are turned OFF by the respective drive signals of the second set, respective MOSFETs of the first set are also turned OFF by the respective drive signals of the first set.

18. The TIA circuit of claim 11, wherein the effective resistance of the TIA is controlled in such a way that the bandwidth of the TIA circuit is selectable to provide multi-data rate operations of the TIA circuit.

19. The TIA circuit of claim 11, wherein the variable current source is a digital-to-analog converter (DAC) current source.

20. The TIA circuit of claim 19, wherein the BWA circuit also includes a fixed current source for generating a reference current IREF, and wherein the fixed current source and the variable current source have well controlled temperature dependencies.

21. The TIA circuit of claim 11, further comprising:
an automatic gain control (AGC) circuit electrically coupled to the optical detector and to the BWA circuit, the AGC circuit being configured to monitor a voltage modulation amplitude (VMA) of the TIA output signal and to compare the VMA with at least a first threshold (TH) value, and wherein the AGC circuit outputs an output current signal, $I_{AGC}$, that is based at least on the comparison of the VMA with at least the first TH value, and wherein the BWA circuit receives the current signal $I_{AGC}$ and combines the current signal $I_{AGC}$ with the current signal $I_{BW}$ and uses the combined current signal to produce said at least one drive signal.

22. A method for performing bandwidth adjustment and automatic gain control in a transimpedance amplifier (TIA) circuit comprising:
providing a TIA circuit comprising at least a TIA and a bandwidth adjustment (BWA) circuit, the BWA circuit being electrically coupled with the TIA, the TIA being electrically coupled to an optical detector that generates an electrical current signal by converting an optical signal into the electrical current signal;
in the TIA, receiving the electrical current signal generated by the optical detector;
with the BWA circuit, generating a BWA signal;
in the BWA circuit, using at least the BWA signal to produce at least one drive signal;
outputting said at least one drive signal from the BWA circuit; and
in the TIA, receiving said at least one drive signal and adjusting an effective resistance of the TIA based on said at least one drive signal to control a gain and a bandwidth of the TIA circuit.

23. The method of claim 22, wherein the TIA circuit further comprises an automatic gain control (AGC) circuit that is electrically coupled to the optical detector, the method further comprising:
in the AGC circuit, receiving an electrical signal generated by the optical detector and comparing the received electrical signal with at least a first threshold (TH) value;
outputting an AGC output signal from the AGC circuit that is based at least on the comparison of the received electrical signal with at least the first TH value; and
in the BWA circuit, combining the AGC output signal with the BWA signal to produce a combined signal and using the combined signal to generate said at least one drive signal.

24. The method of claim 22, wherein the gain and bandwidth of the TIA are temperature-independent.

* * * * *